United States Patent [19]

Lilja

[11] Patent Number: 5,844,983

[45] Date of Patent: Dec. 1, 1998

[54] METHOD AND APPARATUS FOR CONTROLLING A TELEPHONE RING SIGNAL

[75] Inventor: Patrik Hans Lilja, Raleigh, N.C.

[73] Assignee: Ericsson Inc., Research Triangle Park, N.C.

[21] Appl. No.: 891,126

[22] Filed: Jul. 10, 1997

[51] Int. Cl.⁶ .............................. H04M 3/00; H03G 3/20
[52] U.S. Cl. ............................................. 379/418; 381/57
[58] Field of Search ..................... 379/418, 390, 379/377, 373, 372; 381/104, 107, 57; 340/825.44; 367/197, 198, 199; 375/244, 227; 455/62, 63, 67.1, 67.3, 67.7

[56] References Cited

U.S. PATENT DOCUMENTS

| | | | |
|---|---|---|---|
| 4,076,968 | 2/1978 | Watenbarger | 179/84 |
| 4,307,385 | 12/1981 | Evans et al. | 340/540 |
| 4,829,565 | 5/1989 | Goldberg | 379/390 |
| 4,904,992 | 2/1990 | Grothouse | 340/825.44 |
| 5,093,658 | 3/1992 | Grothause | 340/825.44 |
| 5,170,499 | 12/1992 | Grothouse | 455/238.1 |
| 5,204,970 | 4/1993 | Stengel et al. | 455/69 |
| 5,323,456 | 6/1994 | Oprea | 379/375 |
| 5,450,494 | 9/1995 | Okubo et al. | 381/57 |
| 5,485,515 | 1/1996 | Allen et al. | 379/391 |
| 5,563,942 | 10/1996 | Tulai | 379/351 |
| 5,615,256 | 3/1997 | Yamashita | 379/390 |
| 5,666,426 | 9/1997 | Helms | 381/57 |

*Primary Examiner*—Krista Zele
*Assistant Examiner*—Charles N. Appiah
*Attorney, Agent, or Firm*—David C. Hall

[57] ABSTRACT

A telephone has a receiver, a transmitter, a control interface, an audio processor and a microprocessor. The audio processor includes a digital signal processor, an input audio unit coupled to a microphone, an output audio unit coupled to a speaker, and a ring signal controller coupled to a transducer/ringer. When an incoming call is received, the audio processor samples the microphone input signal, which is indicative of ambient noise, and performs a spectral analysis of the ambient noise. The audio processor then sets the ring frequency and the ring volume responsive to the ambient noise spectrum and the ring volume control level set by the user.

15 Claims, 5 Drawing Sheets

METHOD AND APPARATUS FOR CONTROLLING A TELEPHONE RING SIGNAL

BACKGROUND OF THE INVENTION

1. Field of Invention

The present invention relates generally to telephone ring signals. More specifically, the present invention relates to an apparatus for automatically controlling certain characteristics of the ring signal of a telephone.

2. Description of Related Art

Telephones, including mobile or cellular telephones, are typically equipped with some means for alerting the user of an incoming call. Typically, this means includes a ringer for generating an audible ring signal to indicate that a call has been received. A cellular or mobile telephone may be used in an environment having a high level of ambient noise, such as in an automobile, at a worksite, or at an exposition. Even in an office environment, ambient noise levels may vary. Under such conditions, it may be difficult or impossible to hear a normal ring signal. Thus, telephone manufacturers have historically provided the user with means for manually setting the ring signal volume.

However, this solution is not entirely satisfactory for a number of reasons. First, as noted, telephones (especially cellular or mobile telephones) may be used in a number of environments in which the ambient noise may vary in both intensity and pitch. For example, the ambient noise level at a worksite may be concentrated in a much lower frequency range than the ambient noise level at an exposition or on a stock market floor. Moreover, the intensity and pitch of the ambient noise within an automobile may vary depending on the conditions under which the automobile is operating (e.g. in the city, on the highway, at low or high speeds, etc.). If the ring signal frequency is in the same frequency range as the ambient noise, the ring signal must be amplified to an extremely high level to ensure that it will be heard by the user. Otherwise, the ring signal may be "lost" in the noise.

Second, although a user may manually set the ring signal volume level, he or she may forget to reset the level once having left the noisy environment. This could lead to the telephone later generating an embarrassingly loud ring in a relatively noise-free environment such as a meeting.

Third, since the volume setting is static, it does not change from moment to moment with the ambient noise level. Thus, the user is required to set the volume level to account for the maximum expected ambient noise level to avoid missing a call. This is especially undeisrable in a battery powered cellular or mobile telephone, because more battery current must be drawn to produce a louder ring signal.

Thus, there exists a need in the art for an improved apparatus and method for controlling the ring signal of a telephone ringer that takes into account both the power level and the spectral content of the ambient noise.

SUMMARY OF THE INVENTION

It is therefore an object of the present invention to provide an apparatus for controlling the ring signal of a telephone ringer that is responsive to both the level and the spectral content of the ambient noise.

It is a further object of the present invention to provide an improved method for controlling the ring signal of a telephone ringer that is responsive to both the level and the spectral content of the ambient noise.

The foregoing and other objects are achieved in a telephone having a receiver, a transmitter, a control interface, an audio processor and a microprocessor. The audio processor includes a digital signal processor, an input audio unit coupled to a microphone, an output audio unit coupled to a speaker, and a ring signal controller coupled to a transducer/ringer.

When an incoming call is received, the audio processor samples the microphone input signal, which is indicative of ambient noise, and performs a spectral analysis of the ambient noise. The audio processor then sets the ring frequency and ring volume responsive to the ambient noise spectrum and the ring volume control level set by the user.

These and other objects of the invention, together with features and advantages thereof will become apparent from the following detailed specification when read with the accompanying drawings in which like reference numerals refer to like elements.

DETAILED DESCRIPTION OF THE PREFERRED EMBODIMENTS

The present invention will now be described with reference to the accompanying drawings, in which a preferred embodiment of the invention is shown. However, this invention may be embodied in many different forms and should not be construed as limited to the specific embodiment shown.

Figure 1:
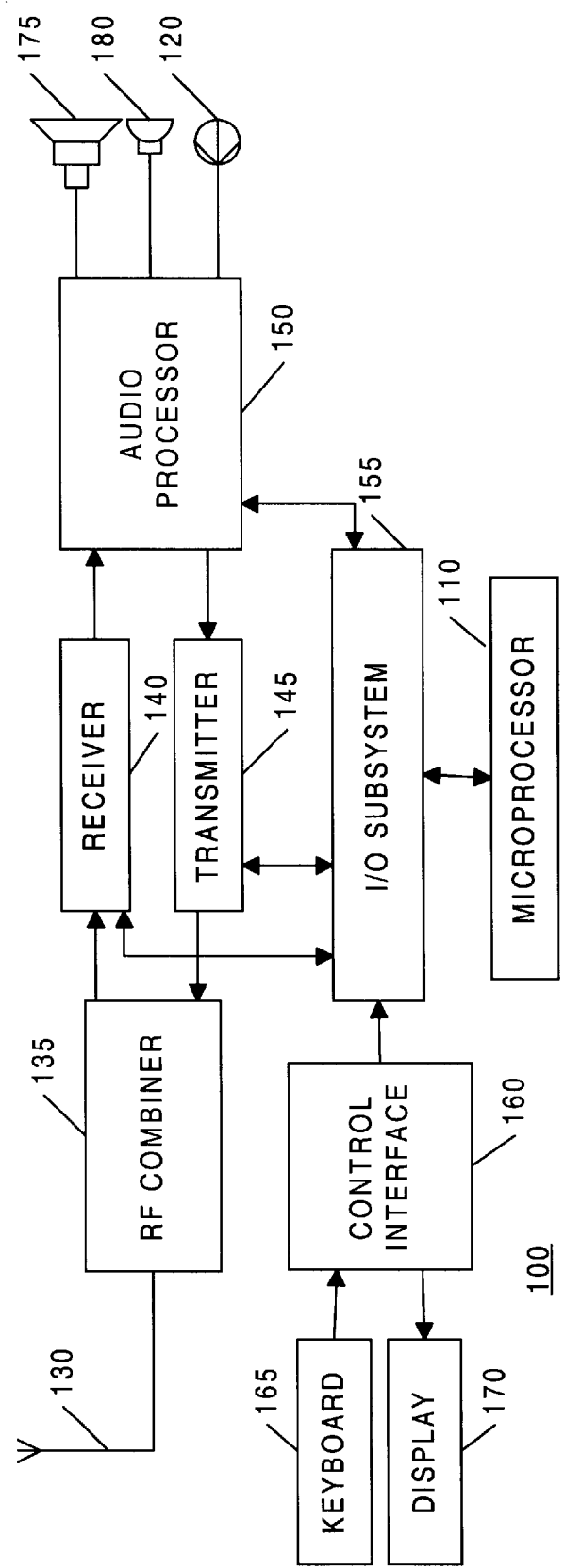
FIG. 1 is a block diagram of a cellular telephone embodying the present invention.

Referring now to FIG. 1, a block diagram of a cellular telephone 100 is illustrated. Cellular telephone 100 includes a receiver 140, a transmitter 145, and an audio processor 150. An RF combiner 135 couples RF signals to and from antenna 130, receiver 140 and transmitter 145. Audio processor 150 is coupled to receiver 140, transmitter 145, speaker 175, microphone 180 and transducer/ringer 120. Transducer/ringer 120 produces an audible notification for the user, for example to notify the user of an incoming call.

Cellular telephone 100 also has a control interface 160 which is connected to a keyboard 165 and a display 170. User control of cellular telephone 100 is accomplished through control interface 160.

The operation of cellular telephone 100 is controlled by a microprocessor 110, which is coupled to receiver 140, transmitter 145, audio processor 150 and control interface 160 through I/O subsystem 155.

Figure 2:
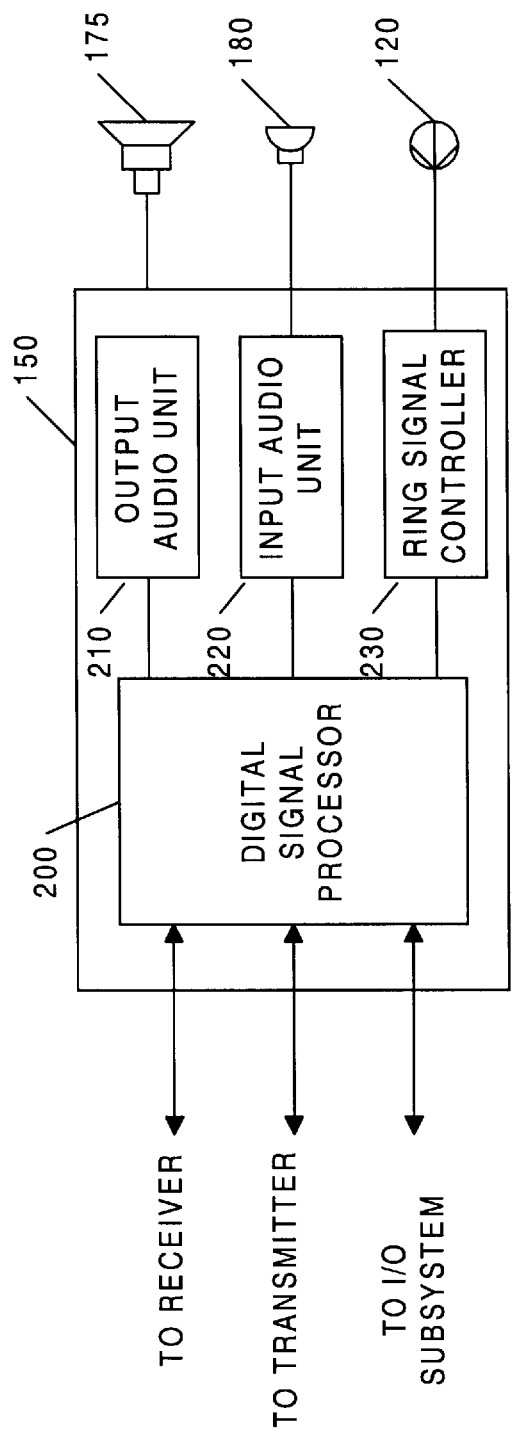
FIG. 2 is a block diagram of the audio processor illustrated in FIG. 1.

As illustrated in FIG. 2, audio processor 150 includes digital signal processor (DSP) 200, output audio unit 210, input audio unit 220, and ring signal controller 230. Output audio unit 210 amplifies audio signals received from DSP 200 and broadcasts the amplified audio signal over attached speaker 175. Input audio unit 220 amplifies sense signals received at microphone 180 and provides the amplified input signal to DSP 200 for processing. Ring signal controller 230 controls the operation of transducer/ringer 120 according to control signals provided by DSP 200. Ring signal controller 230 may be implemented as part of DSP 200.

Cellular telephone 100 has a preset ring signal volume level which may be a factory preset level, or may be set by the user as a menu option in the telephone 100 by means of control interface 160, for example.

Figure 3:
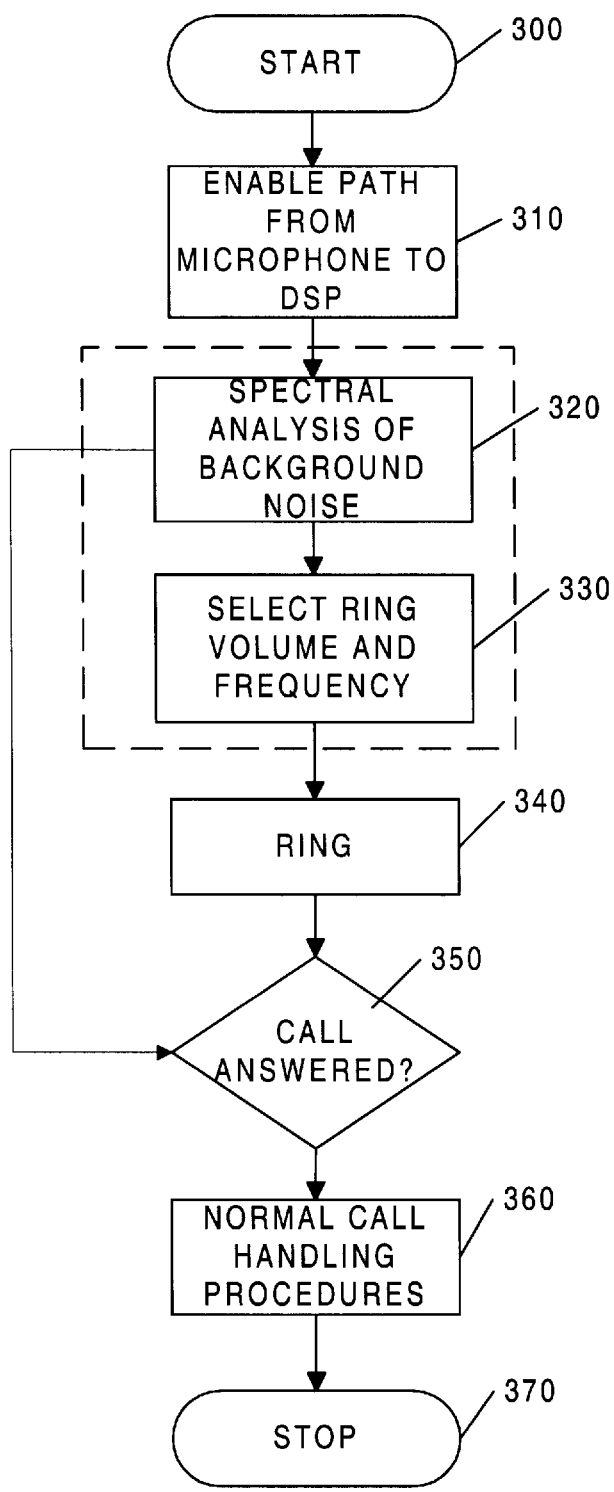
FIG. 3 is a flowchart illustrating a method of controlling the ring signal volume level of a telephone ringer.

FIG. 3 illustrates the operation of the present invention. The process shown in FIG. 3 commences at step 300 when an incoming call is detected by cellular telephone 100. Next, in step 310, an audio path is enabled between microphone 180 and DSP 200 through input audio unit 220. DSP 200 then senses the input signal from microphone 180, which corresponds to the background or ambient noise.

In step 320, DSP 200 receives the signal detected over microphone 180 and converts the signal to a digital signal comprising a plurality of digital samples. In a preferred embodiment, the samples are 12-bit digital samples taken at a sampling rate of 8000 samples per second. DSP 200 then performs a spectral analysis of the background noise by analyzing the digital samples in a manner described in detail below.

In response to the spectral analysis performed in step 320, DSP 200 proceeds in step 330 to determine the volume and frequency at which the transducer/ringer 230 will be operated. These parameters are passed to ring signal controller 230, which in step 340 causes transducer/ringer 120 to ring.

Next, microprocessor 110 checks in step 350 to see if the incoming call has been answered by the user. If the call has not yet been answered, the process returns to step 320 and recalculates the power of the ambient noise. If the call has been answered, the microprocessor 110 resumes its normal call handling procedures in step 360.

Figure 4:
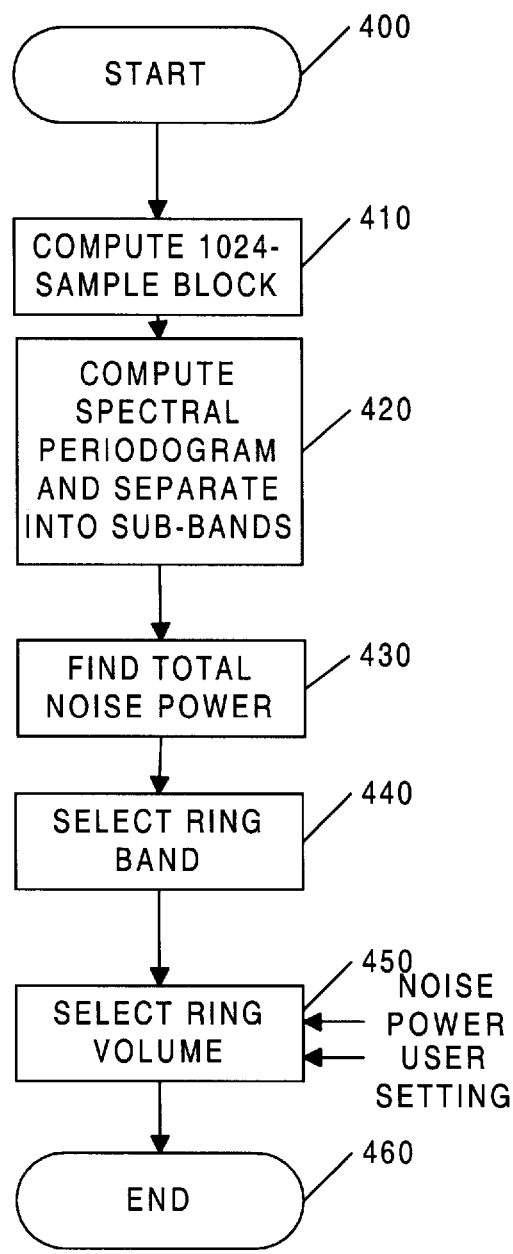
FIG. 4 is a flowchart illustrating an aspect of the method shown in FIG. 3.
Figure 5:
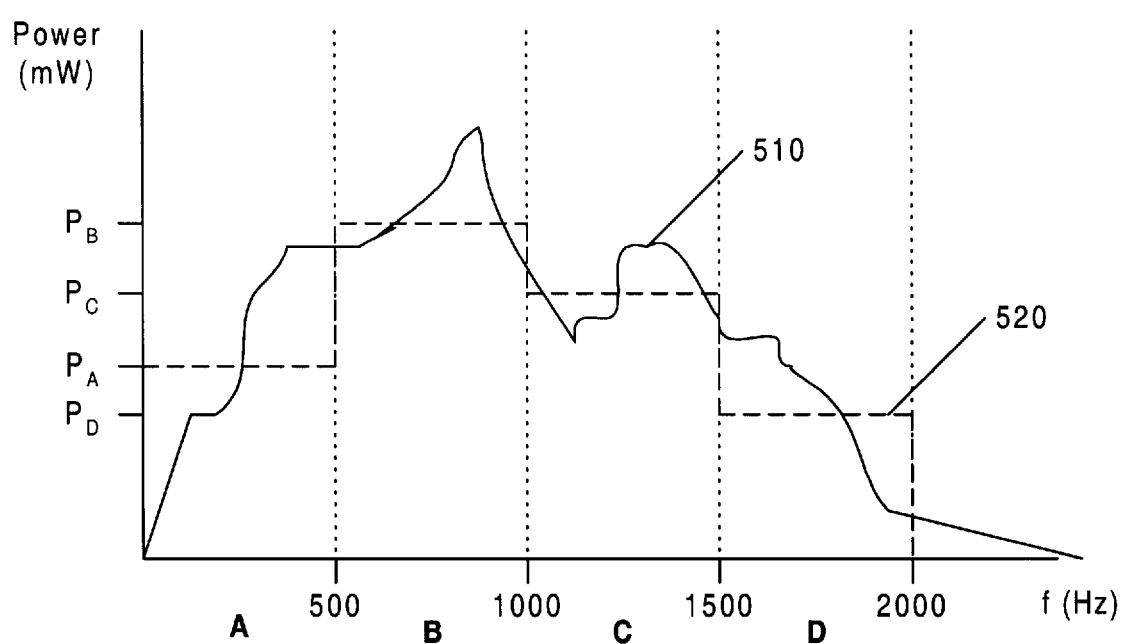
FIG. 5 is a graph of an exemplary ambient noise power spectrum.

FIG. 4 is an elaboration of steps 320 and 330 of the method illustrated in FIG. 3. In step 410, DSP 200 generates a block containing 1024 samples of the ambient noise signal input over microphone 180. In step 420, DSP analyzes the 1024 sample block by computing a spectral periodogram. The spectral periodogram is divided into a plurality of sub-bands. For example, the spectral periodogram may be divided into four sub-bands, each having a bandwidth of 500 Hz. Specifically, the spectral periodogram for the 1024-sample block may be divided into subbands A, B, C and D, which have frequency ranges 0–500 Hz, 500–1000 Hz, 1000–1500 Hz, and 1500–2000 Hz, respectively. An example of an ambient noise power spectrogram 510 divided into four subbands from 0 to 2000 Hz is shown in FIG. 5. FIG. 5 also shows an average power level 520 for each subband. The total noise power in each subband may also be calculated.

The calculation of the power spectrum of a digital signal is well known. See, for example, A. Peled and B. Liu, *Digital Signal Processing*, pp. 156–159 and L. Couch, *Digital and Analog Communications Systems*, pp. 518–520. It will be appreciated by those skilled in the art that there are a number of ways to characterize the power spectrum of a digital signal without departing from the spirit and scope of the present invention. For example, a discrete cosine transform could be used to characterize the noise power spectrum. Moreover, the power spectrum measurement could be performed by an analog circuit such as a bank of parallel subband filters for receiving the analog noise signal and generating a set of signals proportional to the total noise power in each subband.

Returning to FIG. 4, DSP 200 next calculates the total noise power present in each subband in step 430. From the noise power levels in each subband, the DSP 200 calculates the total ambient noise power level. The ring signal frequency is then selected in step 440 based on the calculation of noise power for each subband. For example, the ring frequency may be set at a frequency in the subband having the lowest total noise power (the "ring subband"). Alternately, there may be designated a preferred subband which will be chosen as the ring subband unless the noise power level in such preferred subband exceeds the noise power level in another subband by a specified amount. Other ring subband selection strategies may be employed without departing from the spirit or scope of the present invention.

In one embodiment, DSP 200 selects the ring frequency from a plurality of possible ring frequencies within the chosen ring subband.

Next, the ring signal volume level is determined by DSP 200 in step 450. The ring signal volume level is set by reading the nominal ring signal volume level initially set by the user. This value is then adjusted upwards or downwards a predetermined level depending upon the value of the total ambient noise power.

When the user initially sets the ring signal level, the radiotelephone 100 samples the ambient noise level and calculates a nominal ring signal to noise ratio. In operation, the radiotelephone will attempt to increase the volume of the ringer to achieve the same ring signal to noise ratio as was set by the user initially.

The selected ring frequency and volume level are then communicated to the ring signal controller 230, which causes the transducer/ringer 120 to ring at the selected frequency and volume. By selecting the ring frequency and ring volume based upon a spectral analysis of the ambient noise as well as an analysis of background noise power levels, it is possible to set a lower ring volume than would otherwise be necessary. This not only avoids the possibility of the telephone ringing louder or softer than desired, but also helps to conserve battery life and telephone talk time in a battery powered telephone.

In one embodiment, the radiotelephone 100 may be operated in one of a plurality of different operating modes, including a handsfree mode and a handheld mode, wherein the function of background controlled ring signal volume is operable only in one of the operating modes, for example the handsfree mode. The present invention is particularly suited for use in a handsfree mode wherein the radiotelephone 100 is mounted in a cradle or dock, since the external microphone is in the same position at all times which helps to produce more reliable and consistent noise measurement figures.

While the present invention has been described with respect to its preferred embodiment, those skilled in the art will recognize that the present invention is not limited to the specific embodiment described and illustrated herein. Different embodiments and adaptations besides those shown herein and described as well as many variations, modifications and equivalent arrangements will now be apparent or will be reasonably suggested by the foregoing specification and drawings, without departing from the substance or scope of the invention.

What is claimed is:

1. Apparatus for controlling a notification signal produced by an electronic device, comprising:

means for generating a noise signal indicative of an ambient noise level, said noise signal having a characteristic power spectrum;

processing means for receiving the noise signal and analyzing the power spectrum of the noise signal;

a transducer for generating a notification signal; and control means, coupled to said processing means and said transducer, for selecting a notification signal frequency in response to the power spectrum of the noise signal and causing said transducer to oscillate at said selected frequency.

2. The apparatus of claim 1, wherein said control means comprises means for selecting a notification signal volume in response to the power spectrum of the noise signal and causing said transducer to ring at said notification signal volume.

3. The apparatus of claim 1, wherein said notification signal is a ring signal.

4. The apparatus of claim 1, wherein said means for generating a noise signal comprises a microphone.

5. The apparatus of claim 1, wherein said processing means comprises a digital signal processor.

6. The apparatus of claim 1, wherein said processing means divides the power spectrum of the ambient noise into a plurality of frequency subbands and calculates a power level of the ambient noise in each of said plurality of subbands.

7. The apparatus of claim 6, wherein said control means selects a notification signal frequency to be within one of said plurality of subbands.

8. The apparatus of claim 7, wherein said control means selects a notification signal frequency to be within the one of said plurality of subbands having the lowest ambient noise power level.

9. The apparatus of claim 7, wherein said control means selects a notification signal frequency to be in a preferred one of said plurality of subbands unless the ambient noise power level in said preferred one of said plurality of subbands exceeds the ambient noise power level in a second one of said plurality of subbands by a predetermined level.

10. A method of controlling a notification signal of an electronic device, comprising the steps of:

generating a noise signal indicative of an ambient noise level, said noise signal having a characteristic power spectrum;

analyzing the power spectrum of the noise signal;

selecting a notification signal frequency in response to the power spectrum of the noise signal.

11. The method of claim 10, wherein said step of analyzing the power spectrum of the ambient noise signal comprises dividing the power spectrum of the ambient noise signal into a plurality of frequency subbands and calculating a power level of the ambient noise in each of said plurality of subbands.

12. The method of claim 11, wherein said step of selecting a notification signal frequency comprises selecting a notification signal frequency to be within one of said plurality of subbands.

13. The method of claim 12, wherein said step of selecting a notification signal frequency comprises selecting a notification signal frequency to be within the one of said plurality of subbands having the lowest ambient noise power level.

14. The method of claim 12, wherein said step of selecting a notification signal frequency comprises selecting a notification signal frequency to be in a preferred one of said plurality of subbands unless the ambient noise power level in said preferred one of said plurality of subbands exceeds the ambient noise power level in a second one of said plurality of subbands by a predetermined level.

15. The method of claim 10, further comprising the step of selecting a notification signal volume in response to the power spectrum of the noise signal.

* * * * *